United States Patent [19]
Polla et al.

[11] Patent Number: 5,209,119
[45] Date of Patent: May 11, 1993

[54] MICRODEVICE FOR SENSING A FORCE

[75] Inventors: Dennis L. Polla, Brooklyn Park; Takashi Tamagawa, Minneapolis, both of Minn.

[73] Assignee: Regents of the University of Minnesota, St. Paul, Minn.

[21] Appl. No.: 626,712

[22] Filed: Dec. 12, 1990

[51] Int. Cl.$^5$ .............................. G01L 7/08; G01L 9/00
[52] U.S. Cl. ........................................ 73/723; 73/720; 73/867.625; 73/867.629; 73/867.636
[58] Field of Search ................... 73/754, DIG. 4, 756, 73/115, 706, 708, 717, 723, 753, 720, 862.64, 862.68, 727, 862.625, 862.629, 862.636; 29/25.35

[56] References Cited
U.S. PATENT DOCUMENTS
2,478,223 9/1949 Argabrite ..................... 73/DIG. 4

Primary Examiner—Donald O. Woodiel
Attorney, Agent, or Firm—Patterson & Keough

[57] ABSTRACT

A microsensor or micromechanical device based upon the piezoelectric properties of thin film lead zirconate titanate (PZT) with a thickness of between 0.1 and 5 microns. The thin film PZT is sandwiched between first and second electrodes which are provided with electrical connection means for electrically connecting the electrodes to a voltage sensor or voltage source. The invention also relates to a method for making such microsensor or micromechanical device.

10 Claims, 3 Drawing Sheets

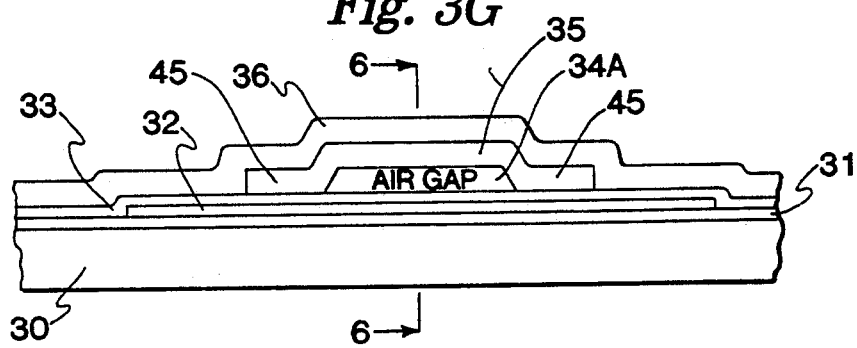
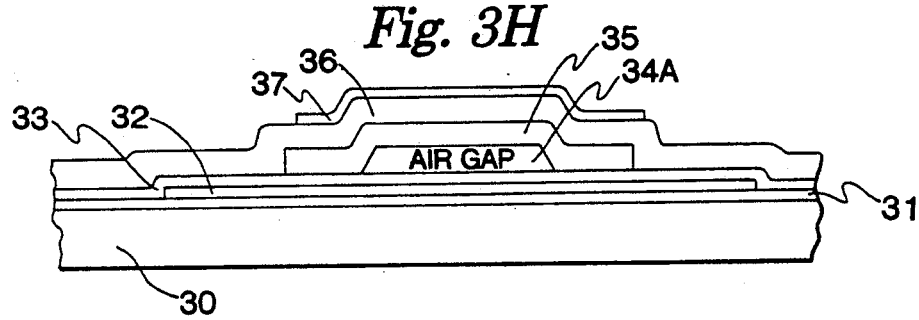
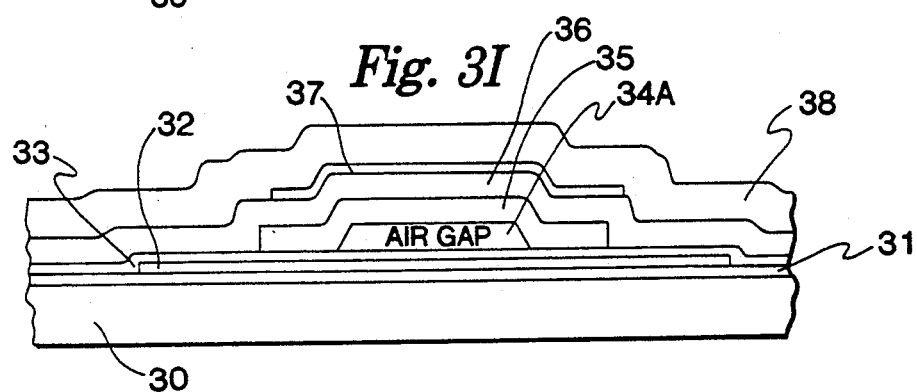
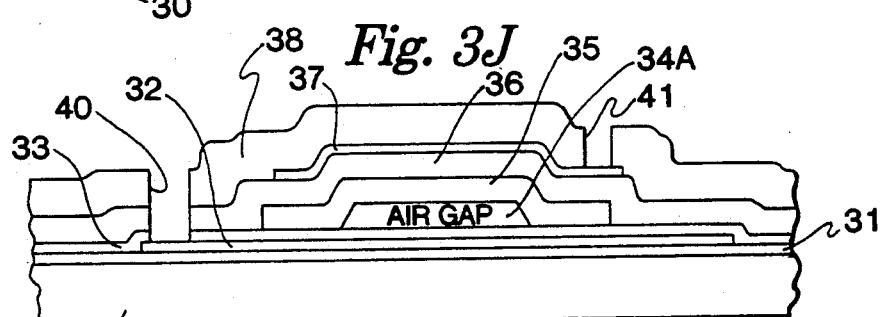
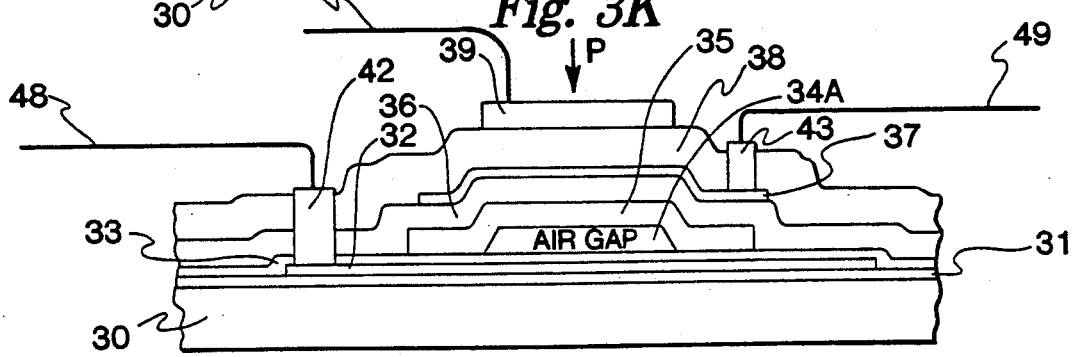

MICRODEVICE FOR SENSING A FORCE

BACKGROUND OF THE INVENTION

1. Field of the Invention

The present invention relates generally to a microstructure for sensing or applying a force and more particularly to a microsensor or a micromechanical actuating device comprising a thin film of lead zirconate titanate (PZT) as the active sensing or actuating material. The present invention also relates to a method of making such a microsensor or micromechanical actuator.

2. Description of the Prior Art

Microsensors such as accelerometers, pressure sensors, infrared detectors and chemical reaction sensors have been made using piezoelectric thin films such as zinc oxide and integrated circuit processing technologies. Micromechanical actuating devices have also been made using similar thin films together with integrated circuit processing techniques commonly known in the art as micromachining. These prior microsensors and micromechanical devices have been based on the piezoelectric properties of the zinc oxide thin film. The piezoelectric properties of a material relate to the interaction of mechanical and electrical stress-strain variables in such material. For example, compression of a material having piezoelectric properties generates an electrostatic voltage across the material, and conversely, application of an electric field across the material will cause the material to expand or contract in certain directions.

The above described microsensor devices function by detecting and measuring electrostatic forces developed in the zinc oxide film as a result of certain stresses or forces acting on the film. Because the electrostatic forces are proportional to the stresses on the film, the magnitude of the stress or force can be determined. The micromechanical devices provide selected mechanical movement or force resulting from the provision of an electrostatic force across the film. By controlling the electrostatic force, a mechanical movement or force of a certain magnitude can be developed. Although these prior art piezoelectric devices are acceptable for certain applications, they suffer from severe problems of low force and high friction. Thus, their applications are quite limited. Accordingly, there is a need in the art for microsensors and micromechanical devices based on piezoelectric properties which overcome the severe limitations of current materials and films.

SUMMARY OF THE INVENTION

In contrast to the prior art, the present invention relates to a microsensor or micromechanical device which uses lead zirconate titanate (PZT) and various related ceramics as the active sensor or actuating material. In the present invention, the PZT is applied as a thin film, with thickness dimensions between about 0.1 and 5 microns and over an effective sensing or actuating area of less than about one millimeter square. The physical piezoelectric and pyroelectric activity of such thin film PZT and related ceramics has been shown to be significantly higher (approximately 10-20 times) than other demonstrated piezoelectric and pyroelectric microsensor materials. Because of the high piezoelectric properties of certain formulations of PZT, it is significantly attractive for both physical sensing and for achieving nano- and micromechanical motion.

The present invention also relates to a method of preparing microsensor and micromechanical devices using the piezoelectric properties of the above mentioned PZT thin films. One step of such method includes the deposition of the thin film PZT onto a base electrode. Although various methods may be useful for the thin film deposition of PZT, the preferred method utilizes a sol-gel technique. With such sol-gel techniques, PZT can be deposited in thin film form as a capacitor onto thin deformable microstructures formed of common metals, polycrystalline silicon, silicon nitride or thin polymers. When a force is applied to such structure, a stress is induced in the PZT thin film which generates a charge in response to this stress through the piezoelectric effect of the PZT film. This charge can be detected and measured and the force determined. Typical microsensor applications for thin film PZT devices can include, among others, acceleration sensing, pressure sensing, physical force sensing, atomic force sensing and sensing principles commonly used in surface-acoustic wave devices.

Because the thin film PZT formulations of the present invention also have a high pyroelectric effect, heat sensitive microsensors can also be formed based upon this property by depositing the PZT on microstructures designed with a low thermal mass. With such a structure, change in film temperature due to incident heat such as infrared radiation, heat released in chemical reactions, convective heat loss in hot wire anemometer devices, etc. will in turn produce a charge across the film as a result of the film's pyroelectric effect. Such charge is then detected and measured. From this, the temperature can be determined.

For micromechanical motion or actuator applications, the piezoelectric effect is utilized in the thin film PZT to generate both force and displacement. In such applications, PZT is deposited in a thin film onto an electrode associated with a free standing or partially unconstrained membrane, diaphragm or cantilever. A voltage is then applied across the PZT thin film which induces a volumetric expansion of the PZT film through the inverse piezoelectric effect. Mechanical movement or positioning of an attached load then results. Anticipated nanoactuation and microactuation applications include, among others, optical fiber positioning, opening and closing of mechanical valves, actuation of fluid pumps, positioning of information reading devices such as magnetic heads, microsurgery devices, and the like.

The particular PZT formulation which is desired for exhibiting sufficient piezoelectric properties has a zironate:titanate ratio of between about 94:6 and 30:70 and preferably a ratio of about 54:46.

A further aspect of the present invention involves making the microsensor or micromechanical device using micromachining or integrated circuit processing techniques. Thus, in its preferred form, the microsensor or micromechanical device of the present invention is mounted on a silicon wafer or die. In such an application, the effective sensing or actuating area of the thin film PZT is less than about one millimeter square. Further, unique techniques have been developed for building a pressure cavity in a microsensor structure.

Accordingly, it is an object of the present invention to provide improved microsensor and micromechanical devices based on the piezoelectric properties of thin film PZT.

Another object of the present invention is to provide a piezoelectric microsensor or micromechanical device using thin film PZT with a thickness of about 0.1 to 5 microns.

A further object of the present invention is to provide a method of making a microsensor or micromechanical device using thin film PZT as the active sensor or actuator material.

Another object of the present invention is to provide a method for making a microsensor or micromechanical device utilizing thin film PZT and integrated circuit processing techniques.

A still further object of the present invention is to provide a method of making a micro pressure sensor.

These and other objects of the present invention will become apparent with reference to the drawings, the description of the preferred embodiment and method and the appended claims.

DESCRIPTION OF THE DRAWINGS

FIGS. 3A-3K represent sequential steps in the production of a surface-micromechanical pressure sensor structure in accordance with the present invention.

DESCRIPTION OF THE PREFERRED EMBODIMENT AND METHOD

In its broadest aspect, the present invention relates to a microsensor or micromechanical device using the piezoelectric or pyroelectric properties of certain formulations of thin film PZT and a method of making the same. Further features of the present invention include, among others, the specific PZT formulations which exhibit the desirable piezoelectric properties for the specific application contemplated, the utilization of sol-gel deposition techniques for depositing and creating the thin film PZT and the utilization of integrated circuit or micromachining processing techniques in the formation of the microsensor and micromechanical devices. These and other features of the present invention will be described in greater detail below.

Figure 1:
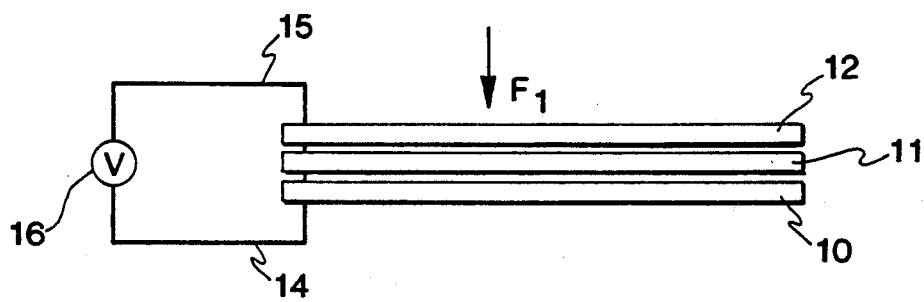
FIG. 1 is a schematic illustration of a microsensor application of the device of the present invention.
Figure 2:
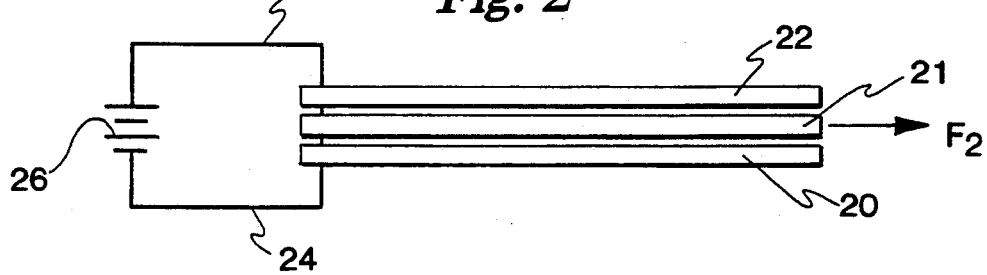
FIG. 2 is a schematic illustration of a micromechanical actuator application of the device of the present invention.

The microsensor and micromechanical devices incorporating the subject matter of the present invention are illustrated schematically in FIGS. 1 and 2, respectively. The electrosensor device of FIG. 1 includes a base or first electrode 10, a thin film of PZT 11 and a top or second electrode 12. Electrical connection means in the form of an electrical lead 14 and an electrical lead 15 electrically connect the electrodes 10 and 12, respectively, to an electrostatic force sensing device in the form of the volt meter 16. When a force or pressure is exerted in the direction of the arrow $F_1$ as illustrated in FIG. 1, certain stresses are created within the thin film PZT 11. This in turn produces an electrostatic charge across the film and between the electrodes 10 and 12 as a result of the piezoelectric property of the PZT film. This charge is detectable through the volt meter 16 and, with appropriate calibration, can be used to determine the magnitude of the force or pressure $F_1$.

In the micromechanical device application of FIG. 2, a thin film of PZT 21 is sandwiched between a base or first electrode 20 and a top or second electrode 22. Electrical connection means in the form of the electrical leads 24 and 25 electrically connect the electrodes 20 and 22, respectively, with a source of an electrostatic force such as a battery 26. Application of electrostatic charge via the battery 26 produces a corresponding electrostatic charge across the electrodes 20 and 22. This, in turn, causes a force or movement to be generated in the direction of the arrow $F_2$ as a result of the piezoelectric properties of the thin film PZT 21. Because the generated force or movement $F_2$ will be proportional to the magnitude of the applied electrostatic charge, such force or movement can be varied by correspondingly changing the electrostatic charge. This can be done with rheostats, switches or other electrical components common in the art.

In the preferred embodiment, the formulation of the PZT is selected so that its piezoelectric or pyroelectric properties are optimized for the particular application desired. For applications contemplated by the present invention, the particular PZT formulation is one that exhibits and possesses a perovskite crystalline structure. Preferably the PZT formulation comprises a zirconate to titanate ratio from about 94:6 to about 30:70. Most preferably, the PZT composition comprises a zirconate to titanate ratio of about 54:46.

The thickness of the thin film PZT 11 and 21 (FIGS. 1 and 2) will be determined by several factors, including, among possible others, the particular piezoelectric properties desired, the specific application of the device and the method utilized to deposit the thin film. Generally, for applications contemplated by the present invention, the PZT film will be between about 0.1 and 5 microns. For applications as a microsensor illustrated in FIG. 1, the preferred thickness of the PZT film 11 is between about 0.1 and 1.0 microns and preferably about 0.5 microns. For applications as a micromechanical device illustrated in FIG. 2, the preferred thickness of the PZT film is between about 1.0 and 5 microns and most preferably about 2.0 microns.

The terms microdevice or microsensor and micromechanical device as used herein are intended to mean sensor and mechanical devices which are formed on a semiconductor such as a silicon wafer or die for use in the formation of a chip. Generally, such wafers have a thickness of between about 0.2 and 2 mm and preferably less than about 1 mm. It is contemplated that the size of the effective sensing or actuating portion of the thin film PZT on such wafers will be less than about one millimeter square ($10^6$ square microns) and greater than about 5 microns square. The effective portion of the PZT film is that portion of the film between the electrodes.

The structure of the electrodes 10 and 12 (FIG. 1) and 20 and 22 (FIG. 2) may be selected from a variety of metals commonly used as electrodes. The particular material which is preferred will depend on various factors including, among others, the method of producing the thin film PZT and the particular application of the device. Of the electrodes, the base electrodes 10 and 20 are most important since these are the electrodes on which the thin film PZT is deposited. A principal requirement of the base electrode 10 and 20 is that it be compatible with formation of the desired crystalline structure of the thin film PZT, namely, the perovskite structure. This results in a film capable of exhibiting the desired piezoelectric properties so that it will function in the manner intended. It has been found that for the base electrode 10 and 20 the preferred material is platinum. Platinum is compatible with, and results in, formation of the desired crystalline structure of the thin film PZT exhibiting high piezoelectric properties. The top or second electrode 11 and 21 can include a variety of conductive metals commonly used as electrodes such as gold, silver, platinum, copper and the like. The preferred material for the top or second electrode 11 and 21, however, is gold.

An important step in the method of producing the microsensor or micromechanical device of the present invention includes the formation of the thin film PZT on the base electrode 10 (FIG. 1) or 20 (FIG. 2). One technique for forming such film is a technique known as sputtering. In general, sputtering involves the application of a thin film material by applying a high electric field between a solid target material and a grounded substrate onto which the film is to be formed. As a result of the electric field, particles are caused to fall from the target material to the substrate, thereby creating the thin film. A limitation of using a sputtering deposition technique to create thin film PZT, however, is the extreme difficulty in getting the right composition in the thin film layer. When dealing with PZT, the specific formulation, and more particularly, the ratio of zirconate to titanate will determine the piezoelectric properties of the film. Thus, if it is desired to alter the zirconate to titanate ratio of the film, a new target material with a new formulation must be prepared. Producing the desired composition of the PZT film is further complicated by the fact that the composition of the PZT film formed on the substrate is not necessarily identical to the composition of the target material and is often not uniform over the deposited area. Further, formation of thin film PZT by sputtering is not particularly good at withstanding certain chemical etching processes after the thin film has been formed.

The preferred method of forming the thin film PZT in accordance with the present invention is the use of sol-gel deposition technologies. Sol-gel deposition techniques generally involve preparation of a chemical solution and application of such chemical solution to the substrate or surface either by dipping or by spin-coating. With a spin-coating technique, the solution is dispensed and the substrate is spun at a rate of between about 1000 to 4000 revolutions per minute. This results in the formation of a thin film or coating over the entire surface of the substrate. Using sol-gel spin-coating techniques, coatings of about 0.1 microns in thickness can be applied. Further details regarding sol-gel deposition technology are available in the prior art.

One advantage of using sol-gel deposition techniques is the ability to better control the composition of the thin film being deposited. For example, if a different film composition is desired, such difference can be accomplished merely by altering the chemical solution of the liquid which is dispensed onto the spinning substrate. This is particularly advantageous in enabling the film compositions to be altered so as to optimize their characteristics for specific sensor and actuator applications. Still further, sol-gel techniques allow for more efficient experimentation with film composition to obtain optimum properties. The thickness of the film formed using sol-gel techniques is dependent upon a number of factors, including, among others, the makeup of the solution being deposited and the speed at which the substrate is rotated. Preferably, application of sol-gel deposition techniques in accordance with the present invention will deposit a film of approximately 0.1 microns or less in thickness. Thus, if thicker films are desired, the sol-gel process is repeated as many times as is necessary to achieve the desired thickness.

An existing problem in the formation of thin film PZT compositions is the tendency of the film to crack when stressed. This problem becomes greater as the film becomes thicker. The problem also becomes greater as the stress to which the film is subjected during use becomes greater. In accordance with the present invention, this problem is overcome by sequential deposition and curing of a plurality of PZT layers. Preferably individual layers of PZT are applied by spin coating at a thickness no greater than 0.2 microns and most preferably at a thickness no greater than 0.1 microns. Following each deposition, the PZT layer is cured at about 400° C. for about 20 minutes. While the time and temperature may vary, they must be sufficient to drive off organic solvents of the PZT solution and crystallize the PZT to the proper phase. Following the deposition of layers with a total thickness of about 0.2 microns, the PZT is cured at a temperature greater than 550° C. and preferably about 650° C. for 20 minutes to form the desired perovskite crystalline structure in the PZT. The temperature of about 650° C. is necessary for this crystalline structure to form. Alternatively, each cure following each deposit can be cured at a temperature greater than 550° C. and preferably about 650° C. It has been found that the above sequential deposit and cured steps minimize PZT cracking and adhesion problems.

It is contemplated that the production of the microsensors and micromechanical devices in accordance with the present invention will utilize integrated circuit processing and production techniques. In general, integrated circuit processing and production techniques involve sequentially depositing or forming various layers or portions of layers onto a semiconductor substrate such as a silicon wafer or die. These layers or portions of layers are generally formed by a series of material depositions followed by selective removal or patterning of certain portions of the deposition by photolithography and etching. The details of incorporation of integrated circuit processing techniques with the use of thin film PZT in the production of microsensors and micromechanical devices according to the present invention can be understood best with reference to FIGS. 3A-3K, 4, 5 and 6.

Figure 4:
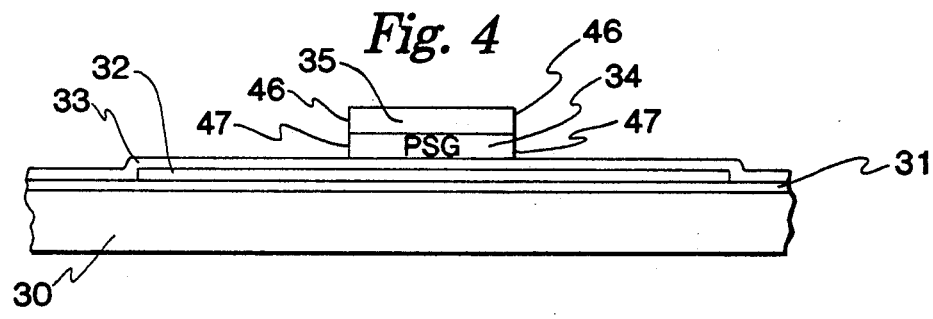
FIG. 4 is a sectional view as viewed along the section line 4—4 of FIG. 3E.
Figure 5:
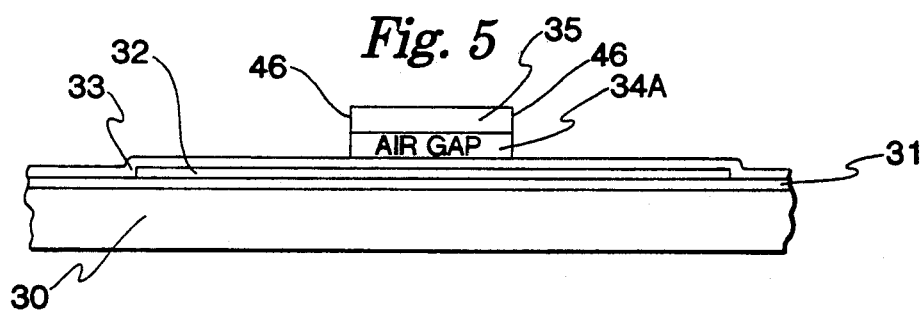
FIG. 5 is a sectional view as viewed along the section line 5—5 of FIG. 3F.
Figure 6:
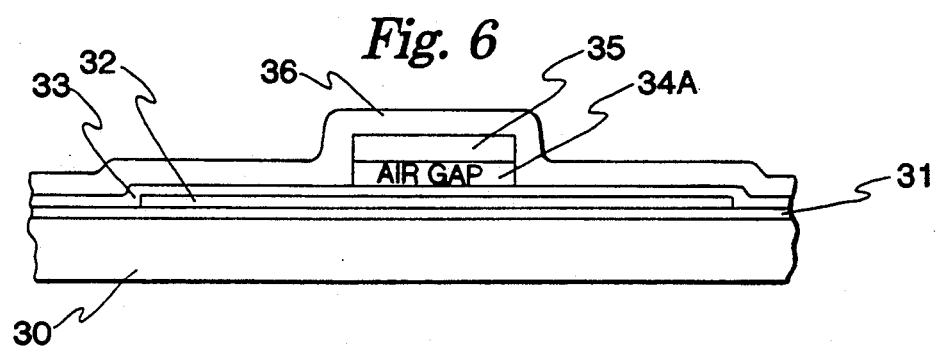
FIG. 6 is a sectional view as viewed along the section line 6—6 of FIG. 3G.
Figure 3A:
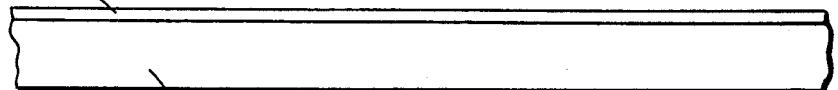
Figure 3B:
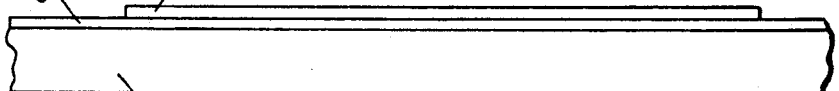
Figure 3C:
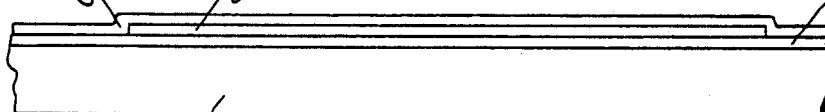
Figure 3D:
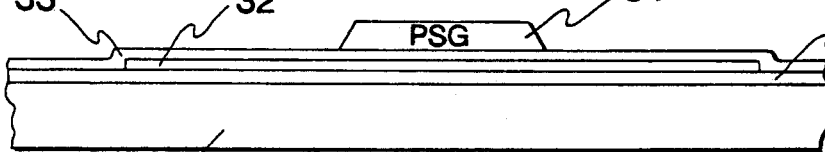
Figure 3E:
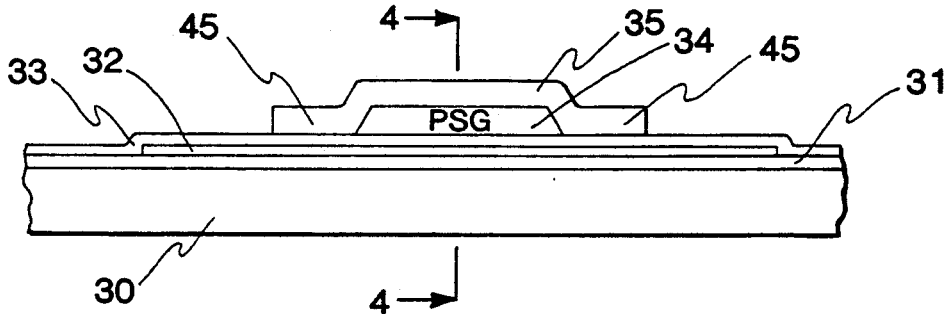
Figure 3F:
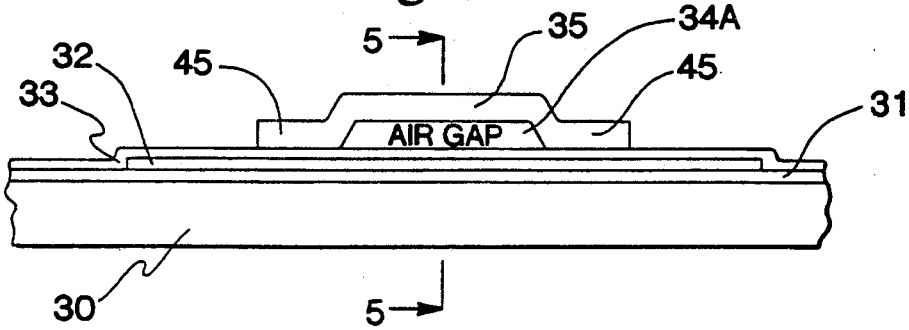

FIG. 3 comprises a series of figures (A-K) illustrating the sequential production of a pressure sensor in accordance with the present invention, while FIGS. 4, 5 and 6 are sectional views of FIGS. 3E, 3F and 3G, respectively. In FIGS. 3A-3K and 4-6, the same components have been given the same reference numerals. In general, the process includes first providing a substrate 30 onto which the various structural components of the sensor or other device are formed. This substrate can be constructed of insulating materials such as quartz or sapphire, but preferably is constructed of a semiconductor such as a silicon which is economical and easy to work with. In the preferred embodiment, the substrate 30 is a silicon wafer of the type commonly used in the production of integrated circuit dies having a thickness of between about 0.2 and 0.5 mm and surface dimensions of between about 2 mm and 10 mm square and thus a surface area of between about 4 and 100 square mm.

As shown in FIG. 3A, the substrate 30 is first cleaned and its surface oxidized to form an oxide layer 31. When the substrate is a silicon based material, the oxide layer is silicon dioxide ($SiO_2$). The oxide layer 31 is formed by thermally oxidizing the surface of the silicon substrate, thus creating a silicon dioxide layer about 500 Å thick.

Next, as shown in FIG. 3B, a pattern of polysilicon 32 is deposited. This is accomplished by first depositing a layer of polysilicon to the entire $SiO_2$ surface 31 by low pressure chemical vapor deposition (LPCVD) in accordance with a procedure known in the art. This layer of polysilicon is then patterned using photolithography and etching in a manner known in the art to produce the pattern of polysilicon 32. The polysilicon 32 serves as the capacitive electrode and is about 0.2 microns thick.

Next, as shown in FIG. 3C, a layer of an insulative material 33 such as silicon nitride ($Si_3N_4$) is applied to the entire surface of the wafer or die including the upper surfaces of the polysilicon electrode 32 and portions of the silicon dioxide layer 31. The silicon nitride layer 33 functions to electrically insulate the polysilicon electrode 32 and is deposited by an LPCVD process to a thickness of about 0.20 microns.

Next, as shown in FIG. 3D, a pattern of phosphorosilicate glass (PSG) 34 is formed on a central portion of the device. The pattern PSG 34 is formed by first depositing a layer of PSG over the entire surface, followed by selective lithography and etching in a manner known in the art. In the preferred method, the application of the PSG layer 34 is accomplished via an LPCVD process to a thickness of about 0.8 microns. As will be described in greater detail below, the PSG serves as a sacrificial layer which will subsequently be removed to form the cavity 34A (FIGS. 3F–3K, 5 and 6. The thickness of the PSG layer 34 conforms generally to the height of the cavity 34A.

The formation of the PSG pattern 34 is then followed by formation of a polysilicon structural membrane 35 as shown in FIG. 3E. This is accomplished by deposition of a polysilicon layer over the entire surface by LPCVD, followed by photolithography and etching. In the preferred embodiment, the polysilicon 35 is patterned in the form of a square with lateral dimensions ranging from 10×10 microns square to 800×800 microns square with the preferred size being about 250×250 microns square. Further, the polysilicon 35 is patterned such that two of its lateral sides 45, 45 extend past the corresponding edges of the PSG layer 34 and connect with the silicon nitride layer 33 as shown in FIG. 3E. The other two lateral sides 46, 46 of the polysilicon 35 correspond with the lateral edges of the PSG 34 as shown in FIG. 5, thus leaving two lateral edges 47, 47 of the PSG exposed. The polysilicon layer 35 is then subjected to a stress-strain annealing step at a temperature of about 950° to 1050° C. for about 30 minutes in nitrogen to remove stresses in the polysilicon layer 35.

Following annealing of the polysilicon layer 35, the PSG layer 34 is laterally etched or removed using a hydrofluoric acid solution. This leaves a free standing membrane corresponding to the polysilicon layer 35 with an open cavity or air gap 34A below the polysilicon 35 and between the polysilicon layer 35 and the silicon nitride layer 33 as shown best in FIGS. 3F and 6.

Next, as shown in FIG. 3G, an insulative layer 36 is applied to the entire surface of the wafer. This insulative material is preferably an oxide and most preferably silicon dioxide. The silicon dioxide is deposited either via a plasma enhanced chemical vapor deposition (PECVD) procedure or by sputtering. The silicon dioxide is directionally deposited so that it accumulates or builds vertically to seal the open sides below the polysilicon layer 35 as shown in FIG. 7. The thickness of the silicon dioxide layer must be sufficient to seal the ends of the cavity 34A and preferably is about 1.2 microns thick. After the oxide coating 36 is completed, the cavity 34A is an airtight, sealed cavity. Such cavity 34A is sealed on its top and on a pair of side edges by portions of the polysilicon layer 35 and on its bottom by the silicon nitride layer 33. The remaining two sides of the cavity 34A are sealed by the oxide layer 36. This step also serves to smooth the edges of the structure to improve the uniformity of the sol-gel coating. Thus, the material used in this step is also preferably a planarizing material capable of smoothing out the irregular surface of the substrate and polysilicon layer 35. Other materials may also be used in place of the silicon dioxide providing they are insulative and capable of directional deposition.

Next, a layer 37 of a material which will ultimately serve as the base or first electrode is coated or deposited onto the oxide layer 36. This is illustrated in FIG. 3H. Several different materials may be used for this base electrode, but the choice is restricted by the particular PZT properties required for the contemplated application. Preferably, the material is platinum. Use of platinum as the base electrode onto which the thin film PZT is deposited facilitates the formation of the preferred PZT crystalline structure which exhibits the desired piezoelectric properties. In the preferred procedure, the platinum layer is deposited over the entire wafer surface by sputtering. This is followed by photolithography and etching to produce the platinum pattern 37.

Next, a thin film layer 38 of the desired PZT composition is deposited over the entire surface of the substrate as shown in FIG. 3I. In the preferred method, the PZT is deposited using sol-gel techniques and is deposited to a thickness of between about 0.1 and 5 microns and preferably about 0.5 microns. To achieve this thickness, several sol-gel deposition steps (between 5 and 7) are performed. Between deposition steps, the PZT is cured in the manner previously described to prevent cracking.

Following deposition of the thin film PZT layer 38, contact holes 40 and 41 are etched through various layers to facilitate respective electrical contact with the polysilicon electrode 32 and with the platinum electrode 37 as shown in FIG. 3J. In the preferred method, the contact holes 40 and 41 are formed using photolithography developed for the PZT and other dielectric films and a combination of dry and selected wet etches. As shown, the contact hole 40 is etched through the PZT layer 38, through the oxide layer 36 and through the silicon nitride layer 33 to the polysilicon electrode 32, while the contact hole 41 is etched through the PZT layer so that contact can be made with the platinum electrode 37.

Next, the top or second electrode 39 and the contacts 42 and 43 are formed as shown in FIG. 3K. This is accomplished by first depositing a layer of the electrode material onto the entire surface of the wafer. Various technologies can be used for depositing this layer which will depend to some extent on the particular metal being utilized. Preferably gold is used as the top electrode and contact material. The gold in the preferred method is deposited via an evaporation deposition process. This is followed by patterning the gold using photolithography and etching to produce the electrode 39 and the contacts 42 and 43. Other metals that can be used for the electrode 39 and contacts 42 and 43 include copper, silver, platinum, titanium, tungsten and the like.

Following construction of the device illustrated in FIG. 3K, electrical leads 48, 49 are connected to the contacts 40 and 41 and thus the electrodes 37 and 39, respectively. These leads 48, 49 are in turn connected with means in the form of a voltmeter or the like for detecting and measuring the electrostatic force produced between the electrodes 37 and 39. If the device is exposed to a pressure P (FIG. 3K) at variance with the pressure in the sealed cavity 34A, a proportional flexing of the polysilicon layer or membrane 35 will occur. This in turn results in a corresponding stress in the PZT thin film layer 38. Because of the piezoelectric properties of the PZT layer 38, an electrostatic charge is produced which can be detected and measured. Through calibration, the pressure P to which the device is exposed can be determined.

Although the description of the preferred embodiment has been quite specific, it is contemplated that various modifications can be made without deviating from the spirit of the present invention. Accordingly, it is intended that the scope of the present invention be dictated by the appended claims rather than by the description of the preferred embodiment.

We claim:

1. A microdevice formed integral to an integrated circuit chip for sensing a force comprising:
    a lead zirconate titanate (PZT) piezoelectric thin film having a thickness between about 0.1 and 0.5 microns, said thin film presenting a surface upon which said force acts and being adapted for deflective movement in response to the application of said force;
    first and second electrodes positioned on opposite sides of said PZT thin film, each of said electrodes having an inner surface in operable contact with said PZT thin film and an outer surface defining an outer surface of said microdevice, the first and second electrodes comprising means for sensing the piezoelectric effects produced in the film by said deflective movement of said thin film; and
    electrical connection means for electrically connecting said first and second electrodes to a voltage sensor.

2. The microdevice of claim 1 wherein the size of the said surface upon which said force acts ranges from about 100 square microns to about $1 \times 10^6$ square microns.

3. The microdevice of claim 1 wherein the composition of said PZT thin film has a zirconate:titanate ratio of between about 94:6 and about 30:70.

4. The microdevice of claim 3 wherein the composition of said PZT thin film has a zirconate:titanate ratio of about 54:46.

5. The microdevice of claim 1 wherein said PZT thin film is deposited on said first electrode by sol-gel deposition techniques.

6. The microdevice of claim 5 wherein said first electrode is platinum.

7. The microdevice of claim 1 comprising a pressure sensor having a sealed cavity defined in part by a deformable membrane being operably coupled to said thin film such that a force applied to the membrane results in deformation of said membrane causing a stress in said thin film.

8. The microdevice of claim 7 wherein said PZT thin film and said first and second electrodes form a thin film sensor assembly and said deformable membrane is positioned between said cavity and said thin film sensor assembly.

9. The microdevice of claim 7 wherein said sealed cavity is formed on a silicon die having a size less than about $1 \times 10^6$ square microns.

10. The microdevice of claim 1 comprising a force or pressure microsensor wherein said first and second electrodes are electrically connected with a voltage sensor.

* * * * *

UNITED STATES PATENT AND TRADEMARK OFFICE
CERTIFICATE OF CORRECTION

PATENT NO. : 5,209,119

DATED : May 11, 1993

INVENTOR(S) : Polla et al.

It is certified that error appears in the above-identified patent and that said Letters Patent is hereby corrected as shown below:

Column 1, Line 5 insert the following statement:

"This invention was made with government support under Grant No. ECS-8814651 awarded by the National Science Foundation. The government has certain rights in the invention."

Signed and Sealed this

Fifteenth Day of March, 1994

*Attest:*

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,209,119
DATED : May 11, 1993
INVENTOR(S) : Dennis L. Polla and Takashi Tamagawa It is certified that error appears in the above-identified patent and that said Letters Patent is hereby corrected as shown below:

Column 9,
Lines 31 and 32, delete "0.5 microns" and insert -- 5.0 microns -- therefore.

Signed and Sealed this

Thirty-first Day of August, 2004

JON W. DUDAS
*Director of the United States Patent and Trademark Office*